(12) United States Patent
Logunov et al.

(10) Patent No.: US 8,245,536 B2
(45) Date of Patent: Aug. 21, 2012

(54) LASER ASSISTED FRIT SEALING OF HIGH CTE GLASSES AND THE RESULTING SEALED GLASS PACKAGE

(75) Inventors: Stephan Lvovich Logunov, Corning, NY (US); Sasha Marjanovic, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 396 days.

(21) Appl. No.: 12/276,631

(22) Filed: Nov. 24, 2008

(65) Prior Publication Data

US 2010/0129666 A1     May 27, 2010

(51) Int. Cl.
*C03C 27/06* (2006.01)
(52) U.S. Cl. ............................................. 65/43
(58) Field of Classification Search .................. 65/33.6, 65/36, 43; 445/44
See application file for complete search history.

(56) References Cited

U.S. PATENT DOCUMENTS

| | | | | |
|---|---|---|---|---|
| 5,693,111 | A  * | 12/1997 | Kadowaki et al. | ................ 65/43 |
| 5,883,462 | A  * | 3/1999 | Ushifusa et al. | ............... 313/292 |
| 6,998,776 | B2 * | 2/2006 | Aitken et al. | ................. 313/512 |
| 2006/0084348 | A1* | 4/2006 | Becken et al. | .................. 445/25 |
| 2007/0128966 | A1 | 6/2007 | Becken et al. | .................. 445/25 |
| 2007/0128967 | A1 | 6/2007 | Becken et al. | .................. 445/25 |
| 2007/0286973 | A1 | 12/2007 | Sawai et al. | .................. 428/34.4 |

FOREIGN PATENT DOCUMENTS

| | | |
|---|---|---|
| EP | 1 897 861 | 3/2008 |
| EP | 1 965 452 | 9/2008 |

* cited by examiner

*Primary Examiner* — Jason L Lazorcik
*Assistant Examiner* — Erin Snelting
(74) *Attorney, Agent, or Firm* — Kevin M. Able; William J. Tucker

(57) ABSTRACT

A laser assisted frit sealing method is described herein that is used to manufacture a glass package having a first glass plate (with a relatively high CTE of about $80\text{-}90 \times 10^{-7}$ $C.^{-1}$), a second glass plate, and a frit (with a CTE that is at least about $35 \times 10^{-7}$ $C.^{-1}$), where the frit forms a seal (e.g., hermetic seal) which connects the first glass plate to the second glass plate.

23 Claims, 6 Drawing Sheets

402　108　404

LASER ASSISTED FRIT SEALING OF HIGH CTE GLASSES AND THE RESULTING SEALED GLASS PACKAGE

TECHNICAL FIELD

The present invention relates to a laser assisted frit sealing method used to manufacture a glass package having a first glass plate (with a relatively high CTE of about $80\text{-}90\times10^{-7\circ}$ $C.^{-1}$), a second glass plate, and a frit (with a CTE that is at least about $35\times10^{-7\circ}$ $C.^{-1}$), where the frit forms a seal (e.g., hermetic seal) which connects the first glass plate to the second glass plate.

BACKGROUND

Encapsulation of moisture and oxygen sensitive devices is an important part of manufacturing Organic Light Emitting Diode (OLED) displays. It has been shown that laser assisted frit sealing of OLEDs between two display glass plates, which have a moderate coefficient of thermal expansion (CTE) of about $30\text{-}40\times10^{-7\circ}$ $C.^{-1}$ that are separated by a frit, is feasible at a high speed up to 20-50 mm/s. The relatively high sealing speed up to 20-50 mm/s is an important requirement for enabling a cost efficient manufacturing process. This laser assisted frit sealing process has been described in co-assigned U.S. Patent Application Publication No. 2007/0128966 entitled "Method of Encapsulating a Display Element" and co-assigned U.S. Patent Application Publication No. 2007/0128967 entitled "Method of Making a Glass Envelope". The contents of these two documents are hereby incorporated by reference herein.

However, in applications that are different than display applications, such as solid state lighting or solar cells, where reducing the cost of the materials is much more important, the use of display quality glass is a limiting factor. Thus, the manufacturers prefer to use cheaper glass plates in these types of applications, such as soda lime glass plates. But, the CTE for these types of glass plates is much higher, $\sim 80\text{-}90\times10^{-7\circ}$ $C.^{-1}$. The problem is what changes to the sealing process and/or the frit properties are needed to enable the laser assisted frit sealing of high CTE glass plates to make glass packages that can be used in applications such as solid state lighting or solar cells, for example. Another problem that should be addressed is what changes to the sealing process and/or the frit properties are needed to enable high speed laser assisted frit sealing of high CTE glass plates. These problems and other problems are satisfied by the present invention.

SUMMARY

Broadly, embodiments of the present invention are directed to a glass package and methods of making the glass package. The glass package may be, for example, a glass package containing an electronic component such as an electro-optic component. For example, the glass package may include one or more layers of an organic material such as an organic electro-luminescent material. The glass package may comprise a display device, such as an organic light emitting diode (OLED) display, or the glass package may comprise a photovoltaic device (e.g. solar cell).

In one aspect, embodiments of the present invention include a glass package including: (a) a first glass plate which has a CTE in a range of about $80\text{-}90\times10^{-7\circ}$ $C.^{-1}$; (b) a second glass plate; and (c) a frit which has a CTE which is at least about $35\times10^{-7\circ}$ $C.^{-1}$, where the frit forms a seal which connects the first glass plate to the second glass plate.

In another aspect, embodiments of the present invention include a method for manufacturing a glass package including the steps of: (a) providing a first glass plate, where the first glass plate has a CTE in a range of about $80\text{-}90\times10^{-7\circ}$ $C.^{-1}$; (b) providing a second glass plate; (c) providing a frit, where the frit has a CTE that is at least about $35\times10^{-7\circ}$ $C.^{-1}$; (d) depositing the frit onto the first glass plate or the second glass plate; (e) placing the first glass plate on the second glass plate where the frit is located between the first glass plate and the second glass plate; and (f) using a laser to direct a laser beam through the first glass plate or the second glass plate towards the frit and then moving the laser beam at a predetermined sealing speed along the frit to heat the frit such that the frit melts and forms a seal which connects the first glass plate to the second glass plate, where the laser beam forms a footprint on the frit and has a residence time on a given point of the frit within the footprint that is equal to or greater than 100 msec, equal to or greater than 200 msec, or equal to or greater than 400 msec.

Additional aspects of the invention will be set forth, in part, in the detailed description, figures and any claims which follow, and in part will be derived from the detailed description, or can be learned by practice of the invention. It is to be understood that both the foregoing general description and the following detailed description are exemplary and explanatory only and are not restrictive of the invention as disclosed.

BRIEF DESCRIPTION OF THE DRAWINGS

A more complete understanding of the present invention may be had by reference to the following detailed description when taken in conjunction with the accompanying drawings wherein.

DETAILED DESCRIPTION

Figure 1A:
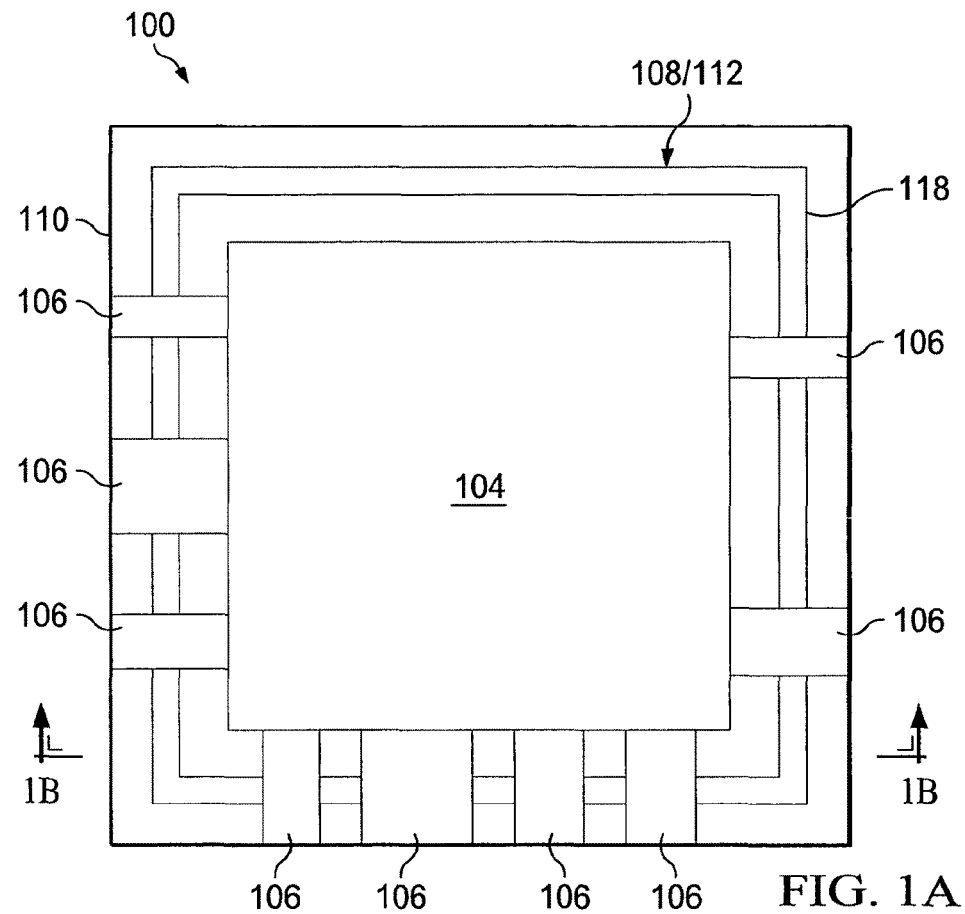
FIGS. 1A and 1B respectively show a cross-sectional side view and a top view that illustrate the basic components of a sealing device and a sealed glass package in accordance with an embodiment of the present invention.

In the following detailed description, for purposes of explanation and not limitation, example embodiments disclosing specific details are set forth to provide a thorough understanding of the present invention. However, it will be apparent to one with ordinary skill in the art and having had the benefit of the present disclosure, that the present invention may be practiced in other embodiments which depart from the specific details disclosed herein. Moreover, descriptions of well-known devices, methods and materials may be omitted so as not to obscure the description of the present invention. Finally, wherever applicable, like reference numerals refer to like elements herein.

Although the laser assisted frit sealing techniques of the present invention are described below with respect to manufacturing a basic glass package, it should be understood that the same or similar laser assisted frit sealing techniques can be used to seal two glass plates (at least one of which has a relatively high CTE of about $80\text{-}90\times10^{-7\circ}$ $C.^{-1}$) to one another, which can be used in a wide variety of applications and devices such as solid state lighting, solar cells and even hermetically sealed OLED displays, for example. Accordingly, the glass package and laser assisted frit sealing technique of the present invention should not be construed in a limited manner.

Figure 1B:
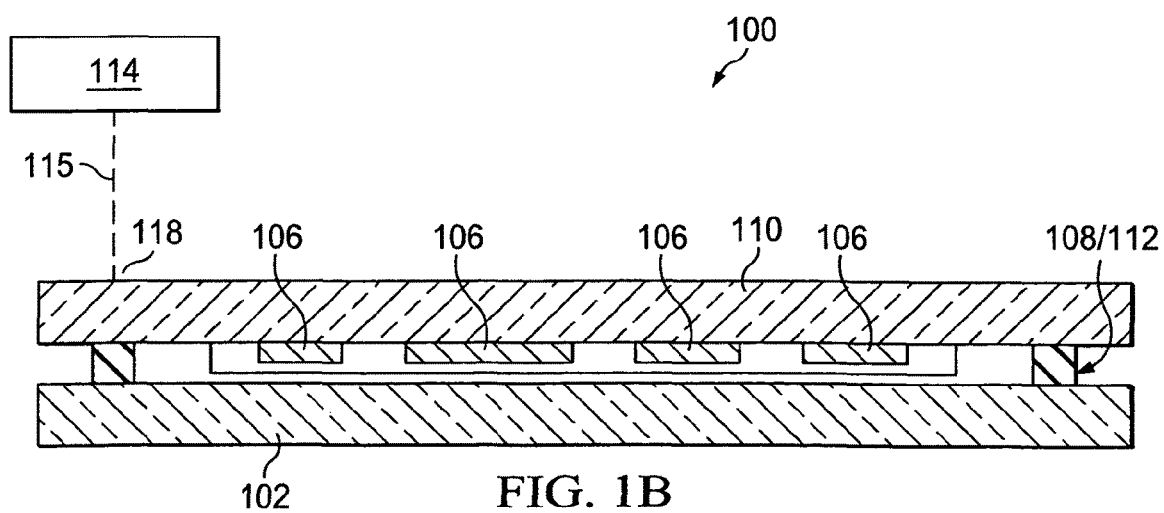

Referring to FIGS. 1A and 1B, there are a top view and a cross-sectional side view illustrating the basic components of the sealed glass package 100 in accordance with the present invention. The sealed glass package 100 includes a first glass plate 102 (which has a CTE in a range of about $80\text{-}90\times10^{-7\circ}$ $C.^{-1}$), one or more components 104, electrodes 106 (optional), a frit 108 (which has a CTE that is at least about $35\times10^{-7\circ}$ $C.^{-1}$), and a second glass plate 110. The sealed glass package 100 has a seal 112 (e.g., hermetic seal 112) formed from the frit 108 which protects the one or more components 104 (if present) located between the first glass plate 102 and the second glass plate 110. The electrode(s) 106 (if present) are connected to the component(s) 104 and also pass through the seal 112 so they can be connected to an external device (not shown). The seal 112 is typically located around the perimeter of the glass package 100 such that the component(s) 104 (if present) and at least a part of the electrode(s) 106 (if present) are located within the perimeter of the seal 112. How the seal 112 is formed by melting the frit 108 and the ancillary components such as a sealing device 114 (e.g., laser 114) which are used to heat and melt the frit 108 to form the seal 112 (e.g., hermetic seal 112) are described in greater detail below with respect to FIG. 2 and the experimental results section.

Figure 2:
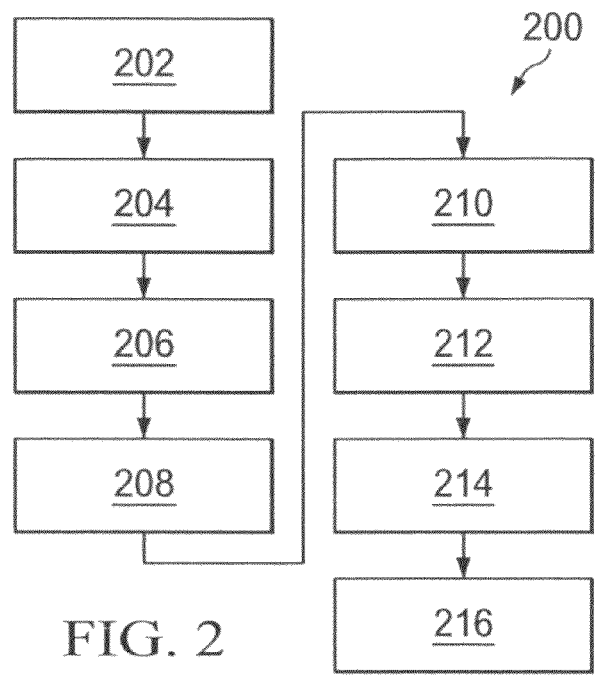
FIG. 2 is a flowchart illustrating the steps of an exemplary sealing method for manufacturing the glass package shown in FIGS. 1A and 1B in accordance with an embodiment of the present invention.

Referring to FIG. 2, there is a flowchart illustrating the steps of an exemplary sealing method 200 for manufacturing the sealed glass package 100 in accordance with the present invention. Beginning at steps 202 and 204, the first glass plate 102 and the second glass plate 110 are provided so that one can make the sealed glass package 100. In one embodiment, the first and second glass plates 102 and 110 are glass plates such as soda lime glass plates and both have CTEs in a range of about $80\text{-}90\times10^{-7\circ}$ $C.^{-1}$. In another embodiment, the first glass plate 102 (or second glass plate 110) is a glass plate such as a soda lime glass plate and has a CTE in a range of about $80\text{-}90\times10^{-7\circ}$ $C.^{-1}$ while the second glass plate 110 (or the first glass plate 102) is a glass plate which has a CTE that is about $30\times10^{-7\circ}$ $C.^{-1}$ or less than the CTE of the first glass plate 102 (or second glass plate 110). For instance, the second glass plate 110 (or the first glass plate 102) which has the CTE that is about $30\times10^{-7\circ}$ $C.^{-1}$ or less than the CTE of the first glass plate 102 (or second glass plate 110) can include alkaline-earth aluminoborosilicate glass plates like the ones manufactured and sold by Corning Incorporated under the brand names of Code 1737 glass or Eagle2000™ glass or it can be like the glass plates manufactured and sold by companies like Asahi Glass Co. (e.g., OA10 glass and OA21 glass), Nippon Electric Glass Co., NHTechno and Samsung Corning Precision Glass Co. (for example).

At steps 206 and 208, the frit 108 (e.g., frit paste 108) which has a CTE that is at least about $35\times10^{-7\circ}$ $C.^{-1}$ is provided and deposited along the edges of the first glass plate 102 (or the second glass plate 110) in a manner that the frit 108 forms a closed-loop on a surface of the first glass plate 102 (or the second glass plate 110). For instance, the frit 108 can be placed approximately 1 mm away from the free edges of the first glass plate 102 (or the second glass plate 110). As can be seen, the frit 108 has a CTE that does not match the CTE(s) of at least one of the glass plates 102 and 110. In one embodiment, the frit 108 is a low temperature glass frit that contains one or more absorbing ions (e.g., transition metals) chosen from the group including iron, copper, vanadium, and neodymium (for example). The frit 108 may also be doped with a filler (e.g., inversion filler, additive filler) to lower the CTE to at least about $35\times10^{-7\circ}$ $C.^{1}$. In one example, the frit 108 could have a composition of $Sb_2O_3$ (23.5 mole %), $V_2O_5$ (47.5 mole %), $P_2O_5$ (27 mole %), $TiO_2$ (1.0 mole %), $Al_2O_3$ (1.0 mole %), $Fe_2O_3$ (2.5 mole %), and at least 10% of a β-eucryptite glass-ceramic CTE lowering filler ($LiAlSiO_4$). The compositions of these frits 108 and several different exemplary frits 108 which could be used in the present invention are discussed in detail in co-assigned U.S. Provisional Patent Application Ser. No. 61/084,007, filed Jul. 28, 2008, and co-assigned U.S. Pat. No. 6,998,776 entitled "Glass Package that is Hermetically Sealed with a Frit and Method of Fabrication". The contents of these documents are hereby incorporated by reference herein.

At step 210 (optional), the frit 108 could be pre-sintered to the first glass plate 102 (or second glass plate 110). To accomplish this, the frit 108 which was deposited onto the first glass plate 102 (or second glass plate 110) would be heated so that it becomes attached to the first glass plate 102 (or second glass plate 110). For instance, the pre-sintering step 208 can be performed by placing the first glass plate 102 and the deposited frit 108 into a furnace where they are heated at 400° C. for 1 hour and then cooled at a controlled rate to prevent the cracking of the frit 108 and the first glass plate 102. If desired, the pre-sintered frit 108 can be ground to reduce its thickness variation to less than 5-10 μm (for example).

At step 212 (optional), the components 104 and associated electrodes 106 are deposited onto the second glass plate 110 (or first glass plate 102). For example, the components 104 and associated electrodes 106 can be associated with OLEDs, solid state lighting, and solar cells. If desired, the glass package 100 can contain a liquid (not shown) instead of or in addition to the components 104 and electrodes 106.

At step 214, the first glass plate 102 is placed on the second glass plate 110 where the frit 108 is located between the first glass plate 102 and the second glass plate 110. Alternatively, the second glass plate 110 can be placed on the first glass plate 102 where the frit 108 is located between the first glass plate 102 and the second glass plate 110.

At step 216, the frit 108 is heated by using the sealing device 114 (e.g., laser 114) in a manner such that the frit 108 forms the seal 112 (e.g., hermetic seal 112) which bonds the first glass plate 102 to second glass plate 110 (see FIG. 1B). In addition, the seal 112 would protect the component(s) 104 (if any) by preventing, for example, oxygen and moisture located within the ambient environment from entering into the sealed glass package 100. In one embodiment, the sealing device 114 (laser 114) directs a laser beam 115 through the first glass plate 102 or the second glass plate 110 (shown) towards the frit 108 and then moves the laser beam 115 at a predetermined sealing speed (e.g., 20-50 mm/s) along the frit 108 to heat the frit 108 such that the frit 108 melts and forms a seal 112 which connects the first glass plate 102 to the second glass plate 110. The laser beam 115 would typically have a spot size that is greater than a width of the frit 108. For example, the width of the frit 108 may be at least 1 mm, hence suitable spot sizes for the laser beam can exceed 1 mm, such as, for example, a beam size of at least about 2 mm, at least about 3 mm or at least about 4 mm in diameter. In particular, the laser beam 115 would form a footprint on the frit 108 and have a residence time on a given point of the frit 108 within the footprint which is equal to or greater than 100 msec, equal to or greater than 200 msec, or even equal to or greater than 400 msec (note: the spot size and footprint can be related to e.g. $1/e^2$, full width max (FWHM) etc. . . . ) The $\geq 100$ msec residence time of the laser beam 115 on a given point of the frit 108 during the sealing process is desirable since this helps prevent cracking and delamination of the frit 108 from the first and second glass plates 102 and 110. A detailed discussion about the sealing step 216 and the residence heating time (heating profile) is provided below in the experimental results section.

If desired, the sealing device 114 (e.g., laser 114) can be used to emit a light 115 (e.g., laser beam 115) that heats the frit 108 in a manner where the temperature of the frit 108 is raised to a substantially constant temperature as the light 115 is moved along the frit 108 (e.g. along a sealing line 118) that has regions free of electrodes 106 and regions occupied by electrodes 106 (if used) while the frit 108 melts and forms the seal 112 which connects the first glass plate 102 to the second glass plate 110. Examples of different sealing techniques and set-ups that can be used to enable a constant temperature sealing technique in the present invention have been described in detail in co-assigned U.S. Pat. No. 7,371,143 entitled "Optimization of Parameters for Sealing Organic Emitting Light Diode (OLED) Displays". The contents of this document are hereby incorporated by reference herein.

Experimental Results

Analysis of the aforementioned laser frit sealing process 200 and sealed high CTE glasses 102 and 110, mostly soda-lime glasses, has been performed. The analysis was performed using visual inspection and a new on-line stress inspection setup to test experimental glass packages 100 made under various sealing conditions including different sealing speeds, laser beam spot sizes, etc. It was found that frit sealing of high CTE glasses using the laser sealing conditions (laser power 33 W, sealing speed 20 mm/s, beam spot size 1.8 mm for 1 mm wide frit) associated with display glass generally produced undesirable cracking and delamination of the frit 108 due to transient and residual stresses in the sealed high CTE glass packages 100. In addition, it was found that the sealing yield of high CTE glass packages 100 could be significantly improved by increasing the residence heating time (the time needed to heat up, seal and cool down the frit 108) by either reducing the sealing speed and/or increasing the spot size of the laser beam 115. This was confirmed by a stress analysis showing a reduction of the stress for soda-lime glass plates 102 and 110 which where sealed with a longer residence heating time. This analysis and additional experiments with other glasses are also described herein to indicate the optimized sealing conditions for high CTE glass plate(s) 102 and 110 and the importance of parameters such as CTE, annealing point, heating profiles, and frit compositions etc., when sealing high CTE glass plate(s) 102 and 110.

Evaluation of Seal Quality

Figure 3:
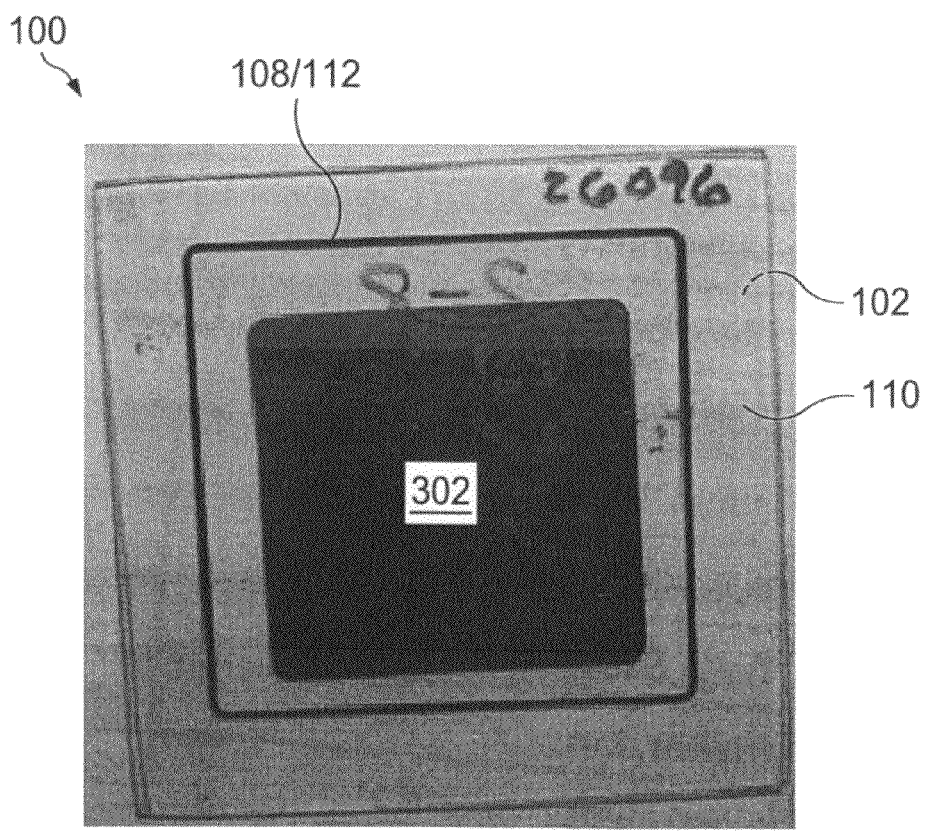
FIGS. 3-9 are diagrams, images and plots which are used to illustrate the results of various experiments that where conducted to test the sealing method and glass package in accordance with an embodiment of the present invention.
Figure 4:
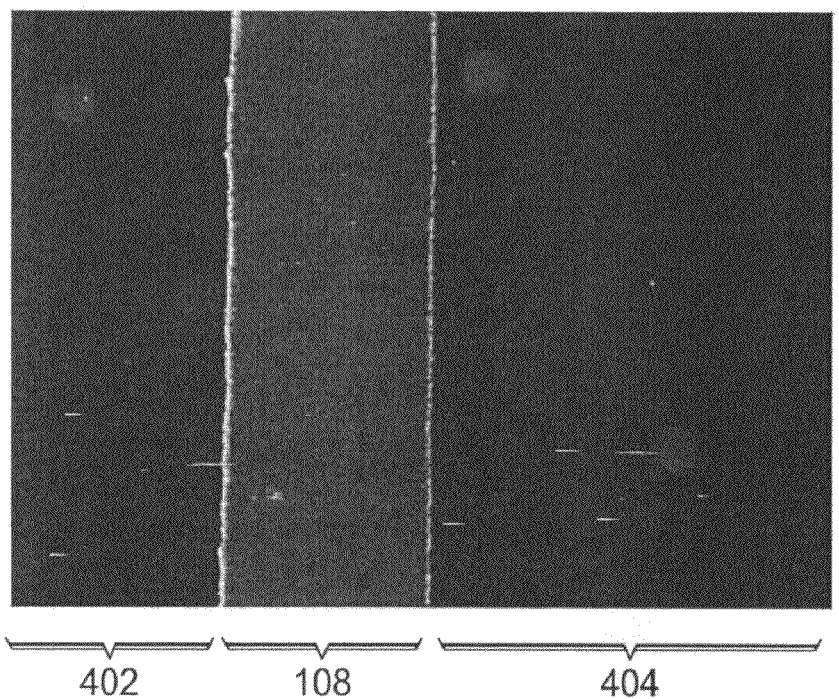

In these experiments, the seal quality was evaluated by visual inspection using an optical microscope with bright and dark illumination similar to what was done to evaluate the seals made by the traditional sealing process described in the aforementioned co-assigned U.S. Patent Application Publication Nos. 2007/0128966 and 2007/0128967 by. By using this process, one could see any defects in the seal 112, possible cracking or delamination of the frit 108 and/or cracking in the glass plates 102 and 110. Typical good quality seals are shown in FIGS. 3 and 4. FIG. 3 is a photo indicating a glass package 100 made with two soda-lime glass plates 102 and 110 and a 1 mm wide frit 108 which sealed a Ca patch 302 using sealing conditions of laser power 33 W, sealing speed 2 mm/s, and an expanded beam spot size 3.2 mm. The calcium patch 302 may be used, for example, to detect leakage of the package (non-hermeticity), and thus can serve as a surrogate for sensitive package contents. For example, the calcium patch 302 can represent the one or more organic layers of an OLED device, and the results of a calcium patch test can be used to determine the effects from a given seal on the OLED device. All or a portion of the calcium patch 302 turning to a "white flaky crust" after a predetermined length of time can be used to indicate the presence of oxygen in the package and potential leakage of the package. FIG. 4 is a microscope photo indicating a traditional glass package made with two low CTE glass plates 402 and 404 (Corning's Eagle® glass plates 402 and 404) and a 1 mm wide frit 108 using sealing conditions of laser power 33 W, sealing speed 20 mm/s, and an expanded beam spot size 3.2 mm. In both cases, the frit 108 had a composition of $Sb_2O_3$ (23.5 mole %), $V_2O_5$ (47.5 mole %), $P_2O_5$ (27 mole %), $TiO_2$ (1.0 mole %), $Al_2O_3$ (1.0 mole %), $Fe_2O_3$ (2.5 mole %), and at least 10% of a β-eucryptite glass-ceramic CTE lowering filler ($LiAlSiO_4$). The sealed glass package 100 (FIG. 3) and the traditional sealed glass package (FIG. 4) survived a hermeticity test in which they where placed for 1000 hours in a 85° C./85% relative humidity chamber.

The inventors experimented with different sealing conditions by varying the laser power, the sealing speed and the beam size. In addition, the inventors experimented with different types of frits 108 including ones with the 30% β-eucryptite filler as well as frits 108 with different amounts of glass to β-eucryptite filler ratio, ranging from 70/30 to 90/10. As shown in TABLE #1, the inventors found that soda-lime glass plates 102 and 110 sealed well with a 1 mm wide frit 108 at a slow speed 2 mm/s with a laser power 33 watts and an expanded beam spot size 3.2 mm, while very high sealing yields could be obtained with Eagle2000® glass plates and 1 mm wide frits 108 using the same sealing conditions but with a sealing speed of 20 mm/s and beam spot size of 1.8 mm. In fact, the sealing results with soda-lime glass plates 102 and 110 where very poor at sealing conditions of laser power 33 W, sealing speed 20 mm/s and beam spot size of 1.8 mm. However, much better sealing results of soda-lime glass plates 102 and 110 where obtained with a slower sealing speed ~2 mm/s and beam spot size 1.8 mm. In addition, the increase of the beam diameter to ~3.2 mm when the frit 108 was 1 mm wide lead to even better results in terms of sealing quality and sealing yield. Both of these adjustments are in the direction of increasing the effective heating time (residence heating time) on an individual location of the glass package 100. Indeed, the inventors have defined the residence heating time, $\tau(eff)$, as D/v, where D is the diameter of the laser beam 115 with a constant beam shape and v is the linear velocity of the laser beam 115 translation along the frit 108. As can be seen, an increase of D and decrease of v lead to an increase of $\tau(eff)$ (see also the discussion about residence heating time in step 216 of FIG. 2). For the low CTE glass plates like the Eagle2000® type, glasses with a CTE of $32$-$36 \times 10^{-7}$ °$C.^{-1}$, the sealing can be done at speeds above 50 mm/s and spot size of 1.8 mm. This means that the residence heating time for this type of low CTE glass can be equal to or smaller than 90 ms. A problem that this present invention solves is that typical residence heating time for high CTE glasses, $80$-$90 \times 10^{-7}$ °$C.^{-1}$ should be at least an order of magnitude higher than in the case of display glasses to prevent cracking and delamination of the frit 108 from the first and second glass plates 102 and 110 (see discussion below).

TABLE #1

| Glass I to glass II seals | CTE [×10$^{-7}$ °C.$^{-1}$] Glass I/glass II | Sealing speed [mm/s] | Glass II Strain point [° C.] | Glass II Anneal point [° C.] | Laser spot size [mm] |
|---|---|---|---|---|---|
| Eagle/Eagle | 32/32 | 20 | 666 | 725 | 1.8 |
| Soda-lime/soda-lime | 89/89 | 2 | 511 | 545 | 3.2 |
| Eagle/Glass A | 32/51 | 20 | 472 | 512 | 1.8 |
| Eagle/Glass B | 32/59 | Didn't seal | 802 | 837 | 1.8 |
| Eagle/Glass C | 32/74 | 20 | 508 | 550 | 1.8 |

Different glasses shown in TABLE #1 have been tested because of their different CTEs and other glasses with similar CTEs would show similar laser sealing results for the same sealing conditions. The compositions of the soda-lime glass and frits identified in TABLE #1 are as follows:

Soda-Lime glass: 73 $SiO_2$, 14 $Na_2O$, 9 CaO, 0.15 $Al_2O_3$, 0.03 $K_2O$, 4 MgO, 0.02 $TiO_2$, 0.1 $Fe_2O_3$.

Frit 108: $Sb_2O_3$ (23.5 mole %), $V_2O_5$ (47.5 mole %), $P_2O_5$ (27 mole %), $TiO_2$ (1.0 mole %), $Al_2O_3$ (1.0 mole %), $Fe_2O_3$ (2.5 mole %), and at least 10% of a β-eucryptite glass-ceramic CTE lowering filler ($LiAlSiO_4$).

Other glasses from TABLE #1 are all Corning's commercially available glasses. Eagle 2000™ glass is an alkaline earth boroaluminosilicate display glass with CTE of 32×10$^{-7}$ °C.$^{-1}$. Glasses A (Corning Code 7058) and B (Corning Code 9753) are lime aluminosilicate glasses, with CTEs of 51×10$^{-7}$ °C.$^{-1}$ and 59×10$^{-7}$ °C.$^{-1}$, respectively. Glass C (Corning Code 0211) is an alkali-zinc borosilicate glass, commercially available as microscope cover glass with CTE of 74×10$^{-7}$ °C.$^{-1}$.

Figure 5:
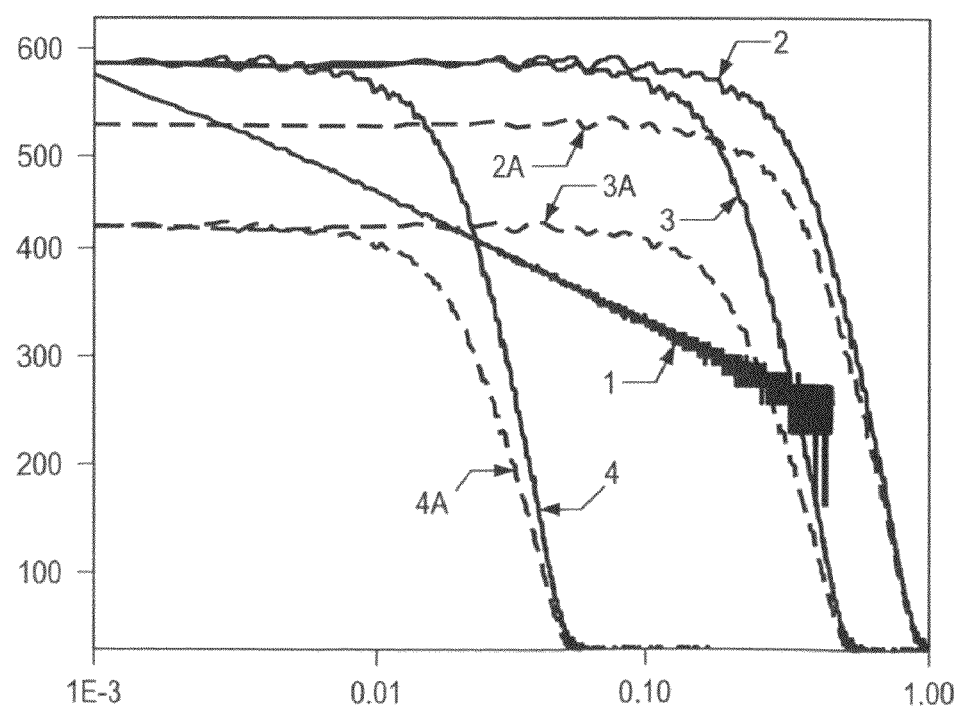

Referring to FIG. 5, there is a plot illustrating the heating profiles of multiple high CTE glass packages 100 as a function of sealing speed or laser beam shape change in accordance with an embodiment of the present invention. In this plot, the x-axis is time (seconds), the y-axis is frit temperature (° C.), and the following numbering scheme is used to identify the various curves:

1. This solid line indicates the intrinsic rate of glass cooling.
2. This solid line indicates the heating profile when sealing at 2 mm/s with a spot size of 3.2 mm while being measured at the center of the 0.7 mm wide frit 108.
2A. This dashed line indicates the heating profile when sealing at 2 mm/s with a spot size of 3.2 mm while being measured on an edge of the 0.7 mm wide frit 108.
3. This solid line indicates the heating profile when sealing at 2 mm/s with a spot size of 1.8 mm while being measured at the center of the 0.7 mm wide frit 108.
3A. This dashed line indicates the heating profile when sealing at 2 mm/s with a spot size of 1.8 mm while being measured on an edge of the 0.7 mm wide frit 108.
4. This solid line indicates the heating profile when sealing at 20 mm/s with a spot size of 1.8 mm while being measured at the center of the 0.7 mm wide frit 108.
4A. This dashed line indicates the heating profile when sealing at 20 mm/s with a spot size of 1.8 mm while being measured on an edge of the 0.7 mm wide frit 108.

As TABLE #1 and FIG. 5 indicate a wider laser beam 115 spot size provides more uniform heating profile, which is important for laser frit sealing of high CTE glass like soda-lime.

Stress Evaluation On-Line and After Sealing Process

Figure 6A:
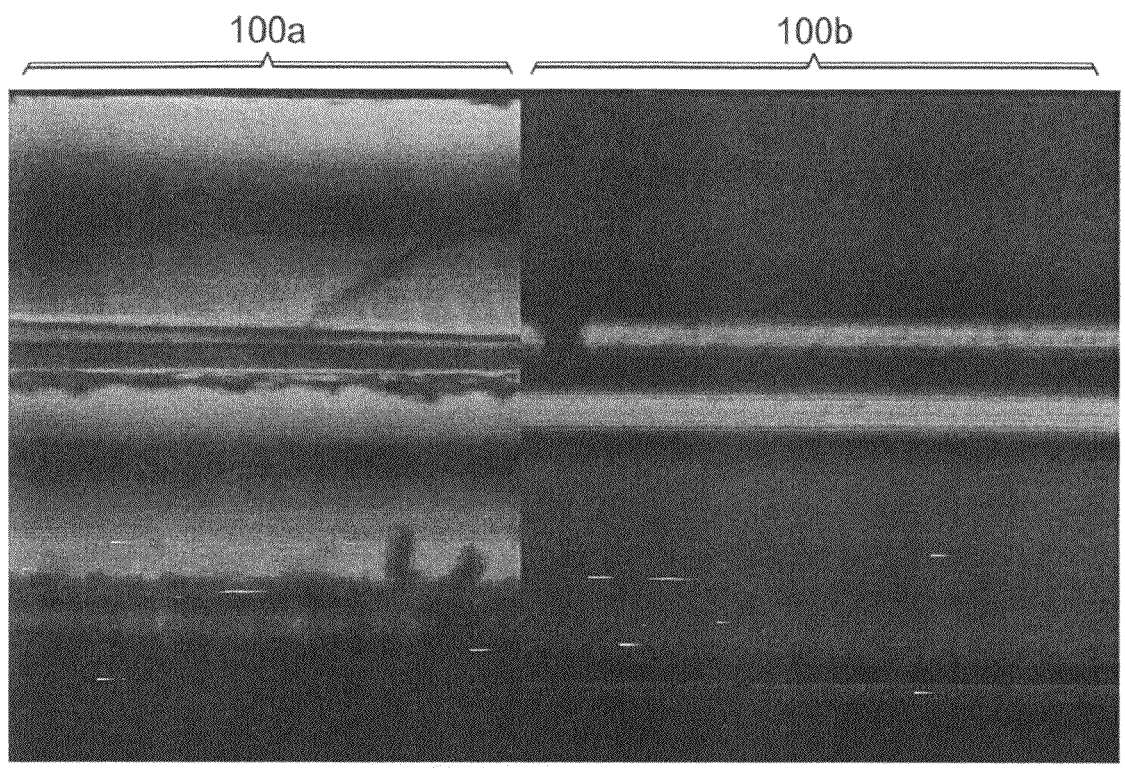
Figure 6B:
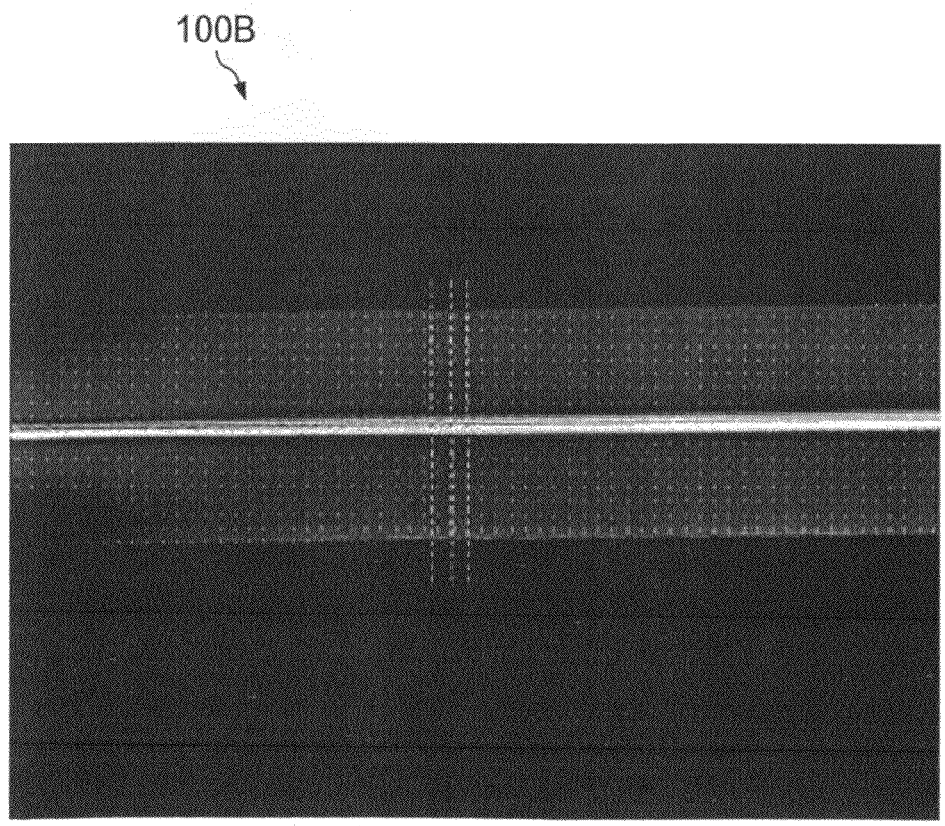

To measure stress in the laser sealed glass packages 100, the inventors put together a setup which measures the in-situ birefringence in the sealed glass packages 100. The setup is similar to the Tardy method that was described in an article by M. H. L. Tardy "An Experimental Method for Measuring the Birefringence in Optical Materials", Optics Review, vol. 8, pages 59-69, 1929 (the contents of which are incorporated by reference herein). However, in these experiments, the inventors monitored the birefringence by using a setup with a fast video camera. This enabled the inventors to calculate the transient stress, and residual stress in the sealed glass packages 100. In particular, the inventors using this setup measured the amount of retardation, which needed to be converted to birefringence and then the birefringence needed to be converted to stress. FIG. 6A is a black and white image of a birefringence map for two tested glass package 100a and 100b each of which are made from 0.63 mm thick soda-lime glass plates 102 and 110 with a typical 1 mm wide frit 108 located there between, where the tested glass package 100a was sealed at 10 mm/s with a 1.8 mm spot laser beam 115 and laser power of 20 watts, and the tested glass package 100b was sealed at 2 mm/s with a 1.8 mm spot laser beam 115 and laser power of 12 watts. It can be seen that the level of stress in the 10 mm/s sealed glass package 100a was significantly higher than the stress in the 2 mm/s sealed glass package 100b (see FIG. 9). For setup calibration, the inventors used the same sealed glass package 100b to compare the residual birefringence obtained from the setup 600 (see FIG. 6A) with the residual birefringence obtained from a standard calibrated polarimeter (see FIG. 6B). FIG. 6B is an image of the soda-lime glass package 100b that was sealed at 2 mm/s illustrating the residual birefringence that was measured using a standard calibrated polarimeter.

Figure 7:
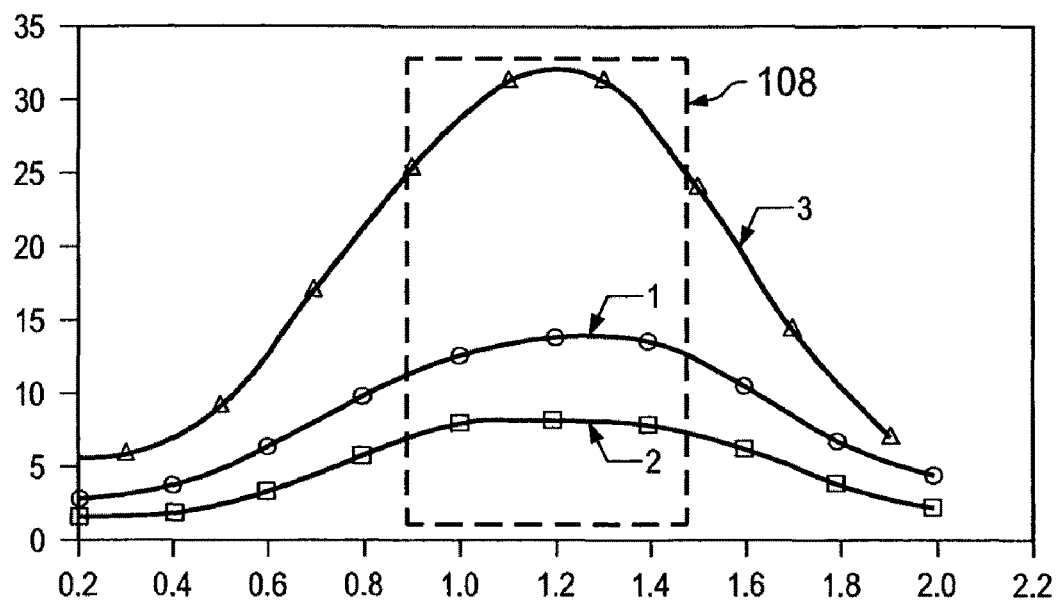

The birefringence was also measured perpendicular to typical frits 108 in several soda-lime glass packages 100 and the data that was collected on a Hinds polaroscope is shown in the plot of FIG. 7. In this plot, the x-axis is distance across the frit (mm), the y-axis is birefringence (nm/cm), and the following numbering scheme is used to identify the various curves:

1. This soda-lime glass package 100 was sealed using a mask at 20 mm/s with laser power 175 watt and laser beam spot size of 4.8 mm.
2. This soda-lime glass package 100 was sealed using a mask at 20 mm/s with laser power 370 watt and laser beam spot size of 6.4 mm.
3. This soda-lime glass package 100 was sealed using a mask at 20 mm/s with laser power 18 watt and laser beam spot size of 1.6 mm.

For reference purposes, a traditional Eagle 2000™ glass package sealed with a laser power of 33 watts, laser beam spot size of 1.8 mm and sealing speed 20 mm/s produced stress that was comparable with the soda-lime glass package 100 which was sealed with laser power of 370 watts, laser beam spot size of 6.4 mm and sealing speed of 20 mm/s. It should be appreciated that the lower the stress then the better the mechanical performance and lifetime of the glass package 100.

Figure 8:
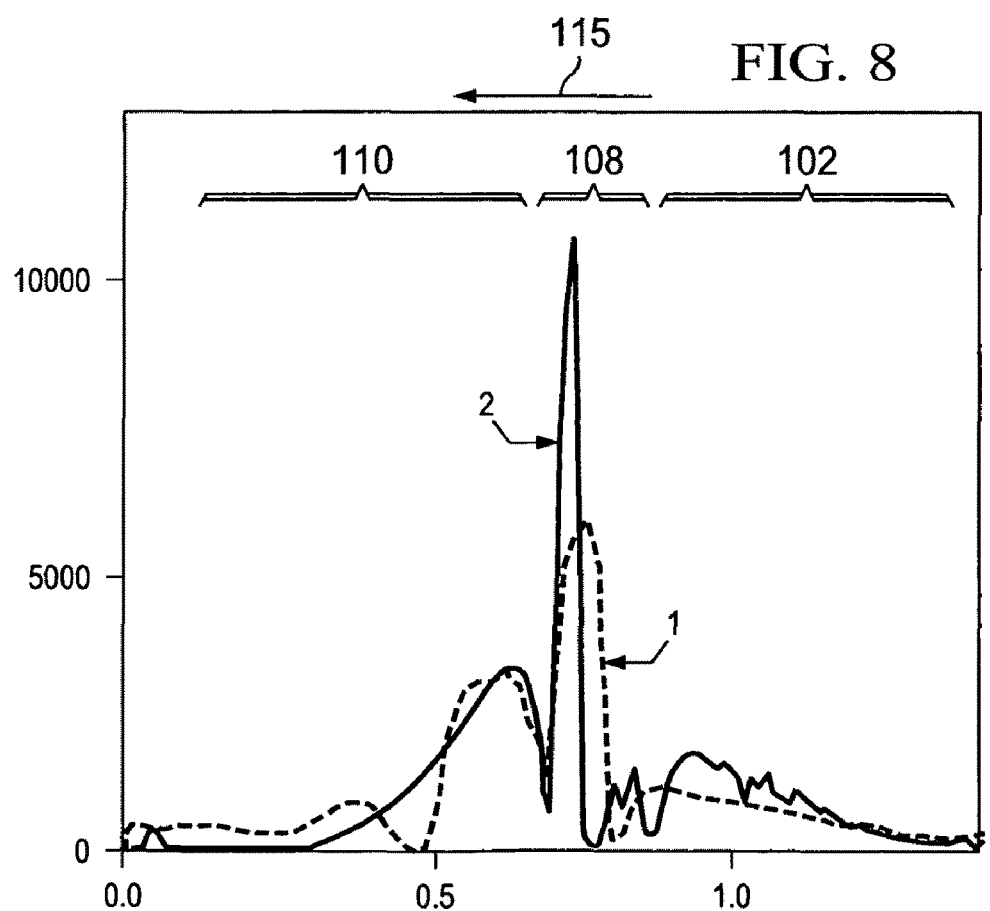

The Hinds polaroscope provides values of birefringence that give an idea about the peak value of stress in the frit 108, and the width of the stress relative to the width of the frit 108. The resulting birefringence, shown in the plot of FIG. 7, could be converted to stress values with known stress-optical coefficients as shown in FIG. 8 when certain assumptions are made about the stress localization along the optical path. In this particular plot, the x-axis is distance (mm), the y-axis is stress (psi) in soda-lime glass packages 100, and the following numbering scheme is used to identify curves associated with sealing conditions: (1) 2 mm/s sealing speed, laser power of 12 watts, laser beam spot size 1.8 mm; and (2) 10 mm/s sealing speed, laser power of 20 watts, laser beam spot size 1.8 mm. Since, it is possible to monitor stress during sealing at any given point of time, peak stress values could be obtained for both transient and residual stresses. This data is summarized in FIG. 9.

Figure 9:
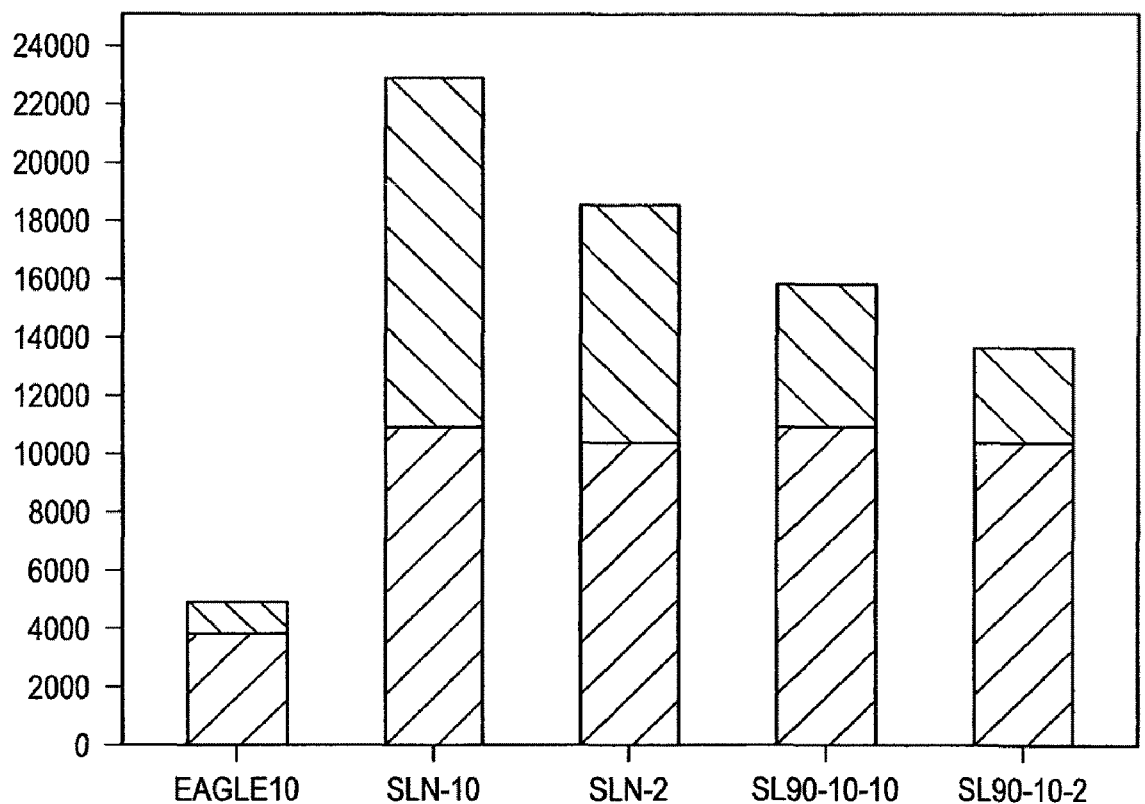

Referring to FIG. 9, there is a graph that summarizes peak stresses for different glasses packages and sealing conditions including both the transient stress (bottom diagonal hatching) and residual stresses (top diagonal hatching). In this plot, the x-axis indicates multiple sampled glass packages, the y-axis is maximum stress (psi), and the samples are identified as follows: (1) Eagle stands for Eagle 2000™ glass plates sealed with typical frit 108; (2) SLN stands for soda-lime glass plates 102 and 110 sealed with typical frit 108; and (3) SL90-10 refers to soda-lime glass plates 102 and 110 sealed with typical frit 108 which contains a 90/10 glass to CTE lowering filler ratio (note: the second number is related to laser sealing speed 2 mm/s or 10 mm/s). In this test, the sealing conditions included laser power of 12 and 20 watts (for 2 and 10 mm/s, respectively), and laser beam spot size of 1.8 mm.

In view of FIG. 9, it can be seen that the value of transient stress was found to be higher for soda-lime glasses than for Eagle 2000™ glass, but the peak value of the stress did not significantly change with different sealing speeds. At the same time, the residual stress values dropped when the sealing was done at slower speed for soda-lime glass. Overall, the difference between Eagle 2000™ glass and soda-lime glass sealing was most noticeable for residual stress values, as shown in FIGS. 7 and 9. Detailed analysis of the various stress patterns showed that, at fast speeds of 10 mm/s and higher, the stress pattern was significantly non-symmetric with respect to the center of the frit 108. Plus, the top soda-lime glass plate 110 was significantly more stressed than the bottom soda-lime glass plate 102, as shown in FIG. 8 and discussed further in a later section herein. This also applies to sealing of low CTE display glass, but it is not that critical since the magnitude of the stress for display glass is lower than in the case of higher CTE glass. For the higher CTE glass, asymmetry of the stress may also be an important factor in the laser seal failing. Thus, based on the test results for both Eagle and soda glass sealing, the amount of residual stress in the glass package 100 should not exceed typical stress values in the traditional glass package by 4-5 times. As can be seen from FIG. 9, the amount of maximum residual stress in the glass package 100 was found to be less than 10.342 Megapascal (MPa) (1500 psi), therefore for the traditional glass package it should be less than 48.263 MPa (7000 psi). In other words, the residual stress in the glass package 100 should not be more than about 10.342 MPa (1500 psi), and for the traditional glass package it should not to be more than 48.263 MPa (7000 psi). The difference in stress from the backplane glass and cover glass should be less than 20-30%.

Effects of the Laser Beam Spot Size

As indicated above, laser sealing of soda-lime glass requires a very significant modification of the heating profile to provide seals 112 with high yield. The inventors conducted soda-lime glass sealing experiments with the aforementioned typical frit 108 for various laser beam 115 spot sizes and sealing speeds. These experiments showed that even at a much lower speed, <1 mm/s, the spot size of 1.8 mm provides low quality seals, while with a spot size >3 mm at sealing at speed of ~2 mm/s resulted in glass packages 100 with quality seals 112. This may be explained by some difference of the residence heating time, the time needed for frit to heat up, seal and cool down (see also step 216 in FIG. 2) and the uniformity of the heating for the center and edge of the frit 108. Uniform heating of the frit 108 ensures that the center and edge of the frit 108 have similar residence heating time. For example, the difference in the residence heating time for the center of the 1 mm wide frit 108 for a 1.8 mm wide beam and 1 mm/s speed (12 W power) will be 1.8 sec, while for a 3.25 mm wide beam and 2 mm/s (30 W power) it is almost the same (~1.6 sec), but the sealing results for a 3.25 mm wide beam was much better. The residence heating time for the edge of the frit 108 will be much shorter for a 1.8 mm beam (than for 3.25 mm beam). It should be appreciated that the laser beam may have an intensity profile (distribution of intensity across the width of the beam) that is step-like, having a substantially uniform intensity across the width of the beam, or the beam may have a Gaussian intensity profile. As used herein, a substantially uniform intensity distribution suggests that some small variation in intensity across the width of the beam is possible. For example, in practice a true step function intensity distribution is very difficult to achieve, and some slope to the "sides" of the distribution, or other small variations in intensity may occur. Typical seals 112 that protect Ca patches 302 (for hermeticity tests) in a glass package 100 made with a 2 mm/s sealing speed have been discussed above with respect to FIG. 3.

To date, three out of four initially tested glass packages 100 that where prepared as discussed in FIG. 3 survived 1000 hours in the 85° C./85% RH chamber. It is noteworthy that the failed glass package 100 had a seal 112 defect at a laser start/stop location, which is known to be the most critical sealing point for both display and soda-lime type glasses. In further experiments with larger numbers of glass packages 100 (more than 20), almost all of the glass packages 100 which did not have visual defects survived at least 1000 hours in the 85° C./85% RH chamber without any visual signs of the frit 108 leaching, while the soda lime glass plates 102 and 110 themselves had significantly weathered.

Sealing at High Speed

To achieve a 20 mm/s sealing speed, the laser beam 115 spot size can be increased to maintain the same heating profile as for lower speeds. This was demonstrated with a 400 W laser power, sealing speed of 20 mm/s, and the laser beam spot size of 9 mm. Due to the limited number of these types of glass packages 100 prepared there is no statistical data, but at least two of these glass packages 100 successfully sealed a Ca patch 302 and survived at least 2000 hours in a lab environment. This suggests that sealing of high CTE glasses can be enabled by maintaining a wide heating profile. This approach allows an increase of the residence heating time across the width of the frit 108 while maintaining the relatively high sealing speed of 20 mm/s.

Frit Modifications

In the case of sealing soda-lime glass plates 102 and 110, it was found that the change of the CTE from the typical frit 108 did not have an important effect on sealing the soda-lime glass plates 102 and 110. In fact, a higher CTE frit 108 with a smaller amount of filler behaved somewhat worse, but successful seals 112 had been made in these glass packages 100.

Sealing of Dissimilar Glasses
Strain Point Effect

The sealing of dissimilar glasses and glasses with properties different from Eagle 2000™ glass and soda-lime glass was also investigated and the results have been summarized above in TABLE #1. As can be seen, the sealing of Eagle 2000™ glass with glasses A and B indicates the importance of the value of the strain point. The lower strain point glasses seal better, which can be explained by looking at the values of the stress. For higher strain point glasses, the overall stress therein is going to be higher than the stress in a glass which has the same CTE but a lower strain point. That is because the stress is developing at temperatures below the strain point of the glass. If the sealing temperature is lower than the strain point of the glass, then the stress value would be the same for glasses with the same CTE. If the strain point is lower than the sealing temperature, then the stress would be lower for a lower strain point glass. This was the case for glasses A and B where glass A with a strain point of 472° C. sealed well to Eagle 2000™ glass, while glass B which had a similar CTE but had a strain point above 800° C. did not seal at all—instead, it delaminated. In general, the overall value of strain $CTE*\Delta T/\Delta t$ (strain point to room temperature) should be lower than a certain value. A typical value for producing a good seal is ~1500 ppm. However, this number can be exceeded if the glass is cooled slower than its intrinsic cooling rate. Thus, in the present invention it is possible that a strain point of the glass plate 102 and 110 minus an equilibrated temperature of the glass plate 102 and/or 110 before the sealing process can be less than 500° C. at a given residence heating time (e.g. >400 msec). For example, if the residence heating time needs to be reduced (<400 msec), according to the above equation, then the $\Delta T$ between strain point and ambient temperature has to be decreased by raising the ambient temperature. For instance, if one needs to seal with a residence heating time <100 mses or <200 msec, then the ambient temperature may need to be increased at least by 200° C. or 100° C., respectively. In particular, in the present invention it is possible that a strain point of the glass plate 102 and 110 minus an equilibrated temperature of the glass plate 102 and/or 110 before the sealing process can be less than about 400° C. at a given residence heating time equal or greater than about 200 msec. And, in the present invention it is possible that a strain point of the glass plate 102 and 110 minus an equilibrated temperature of the glass plate 102 and/or 110 before the sealing process can be less than about 300° C. at a given residence heating time equal to or greater than about 100 msec.

Glass Thickness Effect

The thickness of the glass plates 102 and 110 also plays an important role in glass sealing. Glass C, with a thickness of 150 μm, could be sealed to Eagle 2000™ glass, while the thicker glasses C, >400 μm, developed cracks and delamination at the sealing conditions described above with respect to TABLE #1. Again, these experiments were done with the typical frit 108 which had a composition of $Sb_2O_3$ (23.5 mole %), $V_2O_5$ (47.5 mole %), $P_2O_5$ (27 mole %), $TiO_2$ (1.0 mole %), $Al_2O_3$ (1.0 mole %), $Fe_2O_3$ (2.5 mole %), and at least 10% of a β-eucryptite glass-ceramic CTE lowering filler ($LiAlSiO_4$). Additional experiments with soda-lime glass also showed that sealing thick glass, 2 to 3 mm vs. 0.7 mm, produced lower sealing yields.

It should be understood that the experiments described above used frits 108 with specific dimensions and compositions and the glass plates 102 and 110 had specific compositions but it should be appreciated that different types of frits 108 and different types of glass plates 102 and 110 could be attached to one another using the present invention. In addition, the above experiments involved the use of particular steps and a particular sequence of steps but it should be appreciated that any of these steps or the particular sequence of steps may or may not be implemented to make a sealed glass package 100 using the present invention. Accordingly, the laser assisted frit sealing method 200 and the resulting sealed glass package 100 should not be construed as being limited to a specific type of frit 108, a specific type of glass plate 102 and 110, a specific step, or a specific sequence of steps.

Although multiple embodiments of the present invention have been illustrated in the accompanying Drawings and described in the foregoing Detailed Description, it should be understood that the invention is not limited to the embodiments disclosed, but is capable of numerous rearrangements, modifications and substitutions without departing from the spirit of the invention as set forth and defined by the following claims.

The invention claimed is:

1. A method for manufacturing a glass package, said method comprising the steps of:
   providing a first glass plate, where the first glass plate has a coefficient of thermal expansion, CTE, in a range of about $80\text{-}90\times10^{-7\circ}$ $C.^{-1}$;
   providing a second glass plate;
   providing a frit, where the frit has a CTE that is about $35\times10^{-7\circ}$ $C.^{-1}$;
   depositing the frit onto the first glass plate or the second glass plate;
   placing the first glass plate on the second glass plate where the frit is located between the first glass plate and the second glass plate;
   using a laser to direct a laser beam through the first glass plate or the second glass plate towards the frit and then moving the laser beam at a predetermined sealing speed along the frit to heat the frit such that the frit melts and forms a seal which connects the first glass plate to the second glass plate; and
   wherein the laser beam forms a footprint on the frit, and has a residence time on a given point of the frit within the footprint that is equal to or greater than 100 msec.

2. The method of claim 1, wherein the residence time of the laser beam on the given point of the frit is such that heating and cooling is substantially uniform at both a center and edge of the frit.

3. The method of claim 1, wherein the predetermined sealing speed is about 20-50 mm/s when following a predetermined heating profile to melt the frit and form the seal in a manner that prevents subsequent cracking and delamination of the sealed frit between the first glass plate and the second glass plate.

4. The method of claim 1, wherein the laser beam has a spot size greater than a width of the frit.

5. The method of claim 4, wherein the laser beam has a Gaussian intensity distribution or a substantially uniform intensity distribution.

6. The method of claim 4, wherein the laser beam has a substantially uniform intensity distribution.

7. The method of claim 1, wherein the first glass plate is a soda lime glass plate.

8. The method claim 1, wherein the second glass plate is a soda lime glass plate.

9. The method of claim 1, wherein the first glass plate has a strain point of less than about 500° C.

10. The method of claim 1, wherein a strain point of the first glass plate minus an equilibrated temperature of the first glass plate before the sealing is less than about 300° C. for the residence heating time equal or greater than about 100 msec.

11. The method of claim 1, wherein a strain point of the first glass plate minus an equilibrated temperature of the first glass plate before the sealing is less than about 400° C. for the residence heating time equal or greater than about 200 msec.

12. The method of claim 1, wherein a strain point of the first glass plate minus an equilibrated temperature of the first glass plate before the sealing is less than about 500° C. for the residence heating time equal or greater than about 400 msec.

13. The method of claim 1, wherein the sealed first glass plate has residual stress that is not more than about 1500 pounds per square inch.

14. The method of claim 1, further comprising a step of pre-sintering the frit onto the first glass plate or the second glass plate prior to performing the placing step.

15. The method of claim 1, further comprising a step of depositing at least one component onto the second glass plate prior to performing the placing step.

16. The method of claim 1, wherein the laser is used to heat the frit in a manner where a substantially constant temperature is maintained in the frit along a sealing line while the frit melts and forms the seal which connects the first glass plate to the second glass plate.

17. The method of claim 1, wherein the frit includes a vanadium-phosphate glass and a beta-eucryptite filler.

18. The method of claim 1, wherein the frit includes a glass doped with one or more absorbing ions chosen from the group including iron, copper, vanadium, manganese, cobalt, nickel, chromium, or neodymium.

19. A method for manufacturing a glass package, said method comprising the steps of:
providing a first glass plate, where the first glass plate has a coefficient of thermal expansion, CTE, in a range of about $80\text{-}90 \times 10^{-7\circ}$ C.$^{-1}$;
providing a second glass plate, wherein the second glass plate has a CTE that is less than the CTE of the first glass plate;
providing a frit, where the frit has a CTE that is about $35 \times 10^{-7\circ}$ C.$^{-1}$;
depositing the frit onto the first glass plate or the second glass plate;
placing the first glass plate on the second glass plate where the frit is located between the first glass plate and the second glass plate;
using a laser to direct a laser beam through the first glass plate or the second glass plate towards the frit and then moving the laser beam at a predetermined sealing speed along the frit to heat the frit such that the frit melts and forms a seal which connects the first glass plate to the second glass plate; and
wherein the laser beam forms a footprint on the frit, and has a residence time on a given point of the frit within the footprint that is equal to or greater than 100 msec.

20. The method of claim 19, wherein the predetermined sealing speed is about 20-50 mm/s when following a predetermined heating profile to melt the frit and form the seal in a manner that prevents subsequent cracking and delamination of the sealed frit between the first glass plate and the second glass plate.

21. The method of claim 19, wherein the laser beam has a spot size greater than a width of the frit.

22. The method of claim 19, wherein a strain point of the first glass plate minus an equilibrated temperature of the first glass plate before the sealing is less than about 300° C. for the residence heating time equal or greater than about 100 msec.

23. The method of claim 19, wherein a strain point of the first glass plate minus an equilibrated temperature of the first glass plate before the sealing is less than about 400° C. for the residence heating time equal or greater than about 200 msec.

* * * * *